(12) United States Patent
Rofougaran et al.

(10) Patent No.: US 8,199,060 B2
(45) Date of Patent: Jun. 12, 2012

(54) METHOD AND SYSTEM FOR A PHASED ARRAY ANTENNA EMBEDDED IN AN INTEGRATED CIRCUIT PACKAGE

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/019,007

(22) Filed: Feb. 1, 2011

(65) Prior Publication Data

US 2011/0122037 A1 May 26, 2011

Related U.S. Application Data

(63) Continuation of application No. 11/954,822, filed on Dec. 12, 2007, now Pat. No. 7,880,677.

(51) Int. Cl.
*H01Q 1/38* (2006.01)
(52) U.S. Cl. .................. 343/700 MS; 343/702
(58) Field of Classification Search ........... 343/700 MS, 343/795, 853, 864, 803
See application file for complete search history.

(56) References Cited

U.S. PATENT DOCUMENTS

| | | | |
|---|---|---|---|
| 5,003,622 A | 3/1991 | Ma et al. | |
| 5,015,972 A | 5/1991 | Cygan et al. | |
| 5,798,567 A | 8/1998 | Kelly et al. | |
| 5,861,853 A | 1/1999 | Haub et al. | |
| 5,914,873 A | 6/1999 | Blish, II | |
| 6,060,433 A | 5/2000 | Li et al. | |
| 6,184,828 B1 * | 2/2001 | Shoki | 342/372 |
| 6,573,808 B1 | 6/2003 | Burin | |
| 6,646,581 B1 | 11/2003 | Huang | |
| 6,809,581 B2 | 10/2004 | Rofougaran et al. | |
| 6,853,257 B2 | 2/2005 | Yonekawa et al. | |
| 7,038,625 B1 | 5/2006 | Taylor et al. | |
| 7,081,800 B2 | 7/2006 | He et al. | |
| 7,138,884 B2 | 11/2006 | Cheung | |

(Continued)

FOREIGN PATENT DOCUMENTS

CN 1716695 1/2006

(Continued)

OTHER PUBLICATIONS

Perndl, "Monolithic Microwave Integrated Circuits in SiGe:C Bipolar Technology" Dissertation, Nov. 2004.

(Continued)

*Primary Examiner* — Hoanganh Le
(74) *Attorney, Agent, or Firm* — Farjami & Farjami LLP

(57) ABSTRACT

Aspects of a method and system for configurable antenna in an integrated circuit package are provided. In this regard, a phased array antenna embedded in a multi-layer integrated circuit (IC) package may be utilized for transmitting and/or receiving signals. An IC enabled to transmit and/or receive signals may be bonded to the multi-layer IC package and may communicate a reference signal and/or one or more phase shifted versions of said reference signal to the antenna. One or more phase shifters (fabricated, for example, in planar transmission line) may be embedded in the multi-layer IC package and may be controlled via an IC bonded to the multi-layer IC package. The phased array antenna may comprise a plurality of antenna elements which may each comprise an interconnection for communicatively coupling to an associated transmitter and/or receiver, a feeder line, a quarter wavelength transformer, and a radiating portion (e.g., a folded dipole).

20 Claims, 6 Drawing Sheets

U.S. PATENT DOCUMENTS

| | | |
|---|---|---|
| 7,247,932 B1 | 7/2007 | Lin et al. |
| 7,260,424 B2 | 8/2007 | Schmidt |
| 7,469,152 B2 | 12/2008 | Cetiner et al. |
| 7,675,465 B2 * | 3/2010 | Doan et al. .............. 343/700 MS |
| 2002/0039026 A1 | 4/2002 | Stroth et al. |
| 2004/0001024 A1 * | 1/2004 | Killen et al. ............... 343/792.5 |
| 2004/0041732 A1 | 3/2004 | Aikawa et al. |
| 2004/0150483 A1 | 8/2004 | Cho |
| 2004/0150554 A1 | 8/2004 | Stenger et al. |
| 2004/0201526 A1 | 10/2004 | Knowles et al. |
| 2004/0207504 A1 | 10/2004 | Yang et al. |
| 2004/0222506 A1 | 11/2004 | Wei et al. |
| 2004/0262645 A1 * | 12/2004 | Huff et al. ...................... 257/232 |
| 2004/0263393 A1 * | 12/2004 | Lynch et al. ........... 343/700 MS |
| 2005/0012675 A1 | 1/2005 | Sakiyama et al. |
| 2005/0104665 A1 | 5/2005 | Molnar et al. |
| 2005/0212642 A1 | 9/2005 | Pleskach et al. |
| 2005/0270135 A1 | 12/2005 | Chua et al. |
| 2006/0033671 A1 | 2/2006 | Chan et al. |
| 2006/0091958 A1 | 5/2006 | Bhatti et al. |
| 2006/0092079 A1 | 5/2006 | De Rochemont |
| 2006/0152911 A1 | 7/2006 | Humbert et al. |
| 2006/0267717 A1 | 11/2006 | Posamentier |
| 2007/0013051 A1 | 1/2007 | Heyan et al. |
| 2007/0139112 A1 | 6/2007 | Bocock et al. |
| 2007/0194911 A1 | 8/2007 | Page |
| 2007/0205748 A1 | 9/2007 | Abou |
| 2008/0048760 A1 | 2/2008 | El Rai et al. |
| 2008/0291115 A1 | 11/2008 | Doan et al. |
| 2009/0153260 A1 | 6/2009 | Rofougaran |
| 2009/0153421 A1 | 6/2009 | Rofougaran et al. |
| 2009/0153427 A1 | 6/2009 | Rofougaran |
| 2009/0156157 A1 | 6/2009 | Rofougaran et al. |
| 2009/0179814 A1 | 7/2009 | Park et al. |
| 2009/0189064 A1 | 7/2009 | Miller et al. |
| 2009/0243741 A1 | 10/2009 | Rofougaran |
| 2009/0243749 A1 | 10/2009 | Rofougaran |
| 2009/0243767 A1 | 10/2009 | Rofougaran |
| 2010/0090902 A1 | 4/2010 | Thompson et al. |
| 2010/0327068 A1 * | 12/2010 | Chen et al. .................... 235/492 |

FOREIGN PATENT DOCUMENTS

| | | |
|---|---|---|
| EP | 1146592 | 10/2001 |
| JP | 403019358 | 1/1991 |
| KR | 20050065395 | 6/2005 |
| KR | 200601087503 | 8/2006 |
| WO | WO9621255 A1 | 7/1996 |
| WO | WO2007114620 | 10/2007 |

OTHER PUBLICATIONS

European Search Report for European Patent Application No. 08020760.8-2220, mailed May 19, 2009.

* cited by examiner

METHOD AND SYSTEM FOR A PHASED ARRAY ANTENNA EMBEDDED IN AN INTEGRATED CIRCUIT PACKAGE

CROSS-REFERENCE TO RELATED APPLICATIONS/INCORPORATION BY REFERENCE

This patent application is a continuation of U.S. patent application Ser. No. 11/954,822 filed on Dec. 12, 2007.

The above stated application is hereby incorporated herein by reference in its entirety.

FIELD OF THE INVENTION

Certain embodiments of the invention relate to signal processing. More specifically, certain embodiments of the invention relate to a method and system for a phased array antenna embedded in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is for a phased array antenna in an integrated circuit package, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a phased array antenna embedded in and/or on an integrated circuit package. In this regard, a phased array antenna embedded in a multi-layer integrated circuit (IC) package may be utilized for transmitting and/or receiving signals. The multi-layer package may comprise one or more metal layers, insulating material, ferromagnetic, and/or ferrimagnetic materials. In an exemplary embodiment of the invention, the antenna may comprise one or more planar transmission lines. The phased array antenna may comprise a plurality of antenna elements and each antenna element may comprise an interconnection for communicatively coupling to an associated transmitter and/or receiver, a feeder line, a quarter wavelength transformer, and a radiating portion (e.g., a folded dipole). Also in various exemplary embodiments of the invention, an IC enabled to transmit and/or receive signals may be bonded to the multi-layer IC package via one or more solder balls. Accordingly, the IC may communicate a reference signal and/or one or more phase shifted versions of said reference signal to the antenna. In an exemplary embodiment of the invention, one or more phase shifters (fabricated, for example, in planar transmission line) may be embedded in the multi-layer IC package and may be controlled via logic, circuitry, and/or code within an IC bonded to the multi-layer IC package.

Figure 1A:
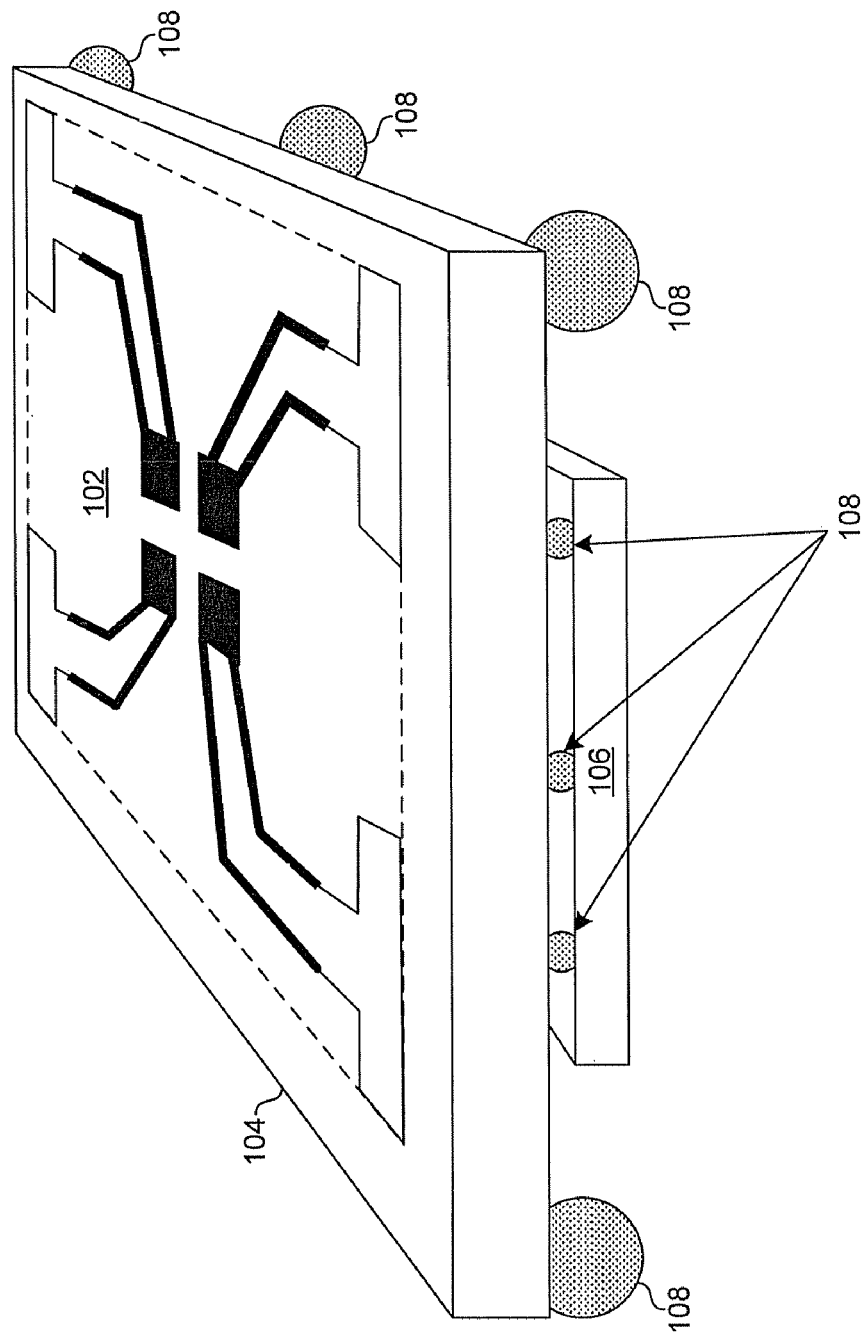
FIG. 1A is diagram illustrating a phased array antenna in an integrated circuit package, in accordance with an embodiment of the invention.

FIG. 1A is diagram illustrating a configurable antenna embedded in and/or on an integrated circuit package, in accordance with an embodiment of the invention. Referring to FIG. 1A, there is shown an multi-layer Integrated circuit (IC) package 102, an associated IC ("chip") 106, a phased array antenna 102, and solder balls 108.

The IC 106 may comprise suitable logic, circuitry, and/or code for performing one or more functions associated with transmitting and/or receiving RF signals. In this regard, the IC 106 may comprise all or a portion of the system 420 described with respect to FIG. 4. In this regard, the IC 106 may utilize a phased array antenna embedded in the package 104 for transmitting and/or receiving RF signals. In this regard, the IC 106 may comprise suitable logic, circuitry and/or code for driving the antenna 102 with a plurality of phase shifted signals. For example, the IC 106 may comprise a transmitter and/or a receiver. Alternatively, the IC 106 may comprise phase shifting circuitry and may be coupled to a separate transmitter and/or receiver (e.g., via one or more traces on a PCB). In still another embodiment, phase shifting elements may be fabricated in the package 104 and the package 104 may be utilized as a "stand alone" or "standardized" antenna which may be communicatively coupled to a variety of transmitters and/or receivers.

The IC 106 may be bump-bonded or flip-chip bonded to the multi-layer IC package 104 utilizing the solder balls 108. In this manner, wire bonds connecting the IC 106 to the multi-layer IC package 104 may be eliminated, reducing and/or eliminating uncontrollable stray inductances due to wire bonds. In addition, the thermal conductance out of the IC 106 may be greatly improved utilizing the solder balls 108 and the thermal epoxy 206 (FIG. 2). The thermal epoxy 221 may be electrically insulating but thermally conductive to allow for thermal energy to be conducted out of the IC 106 to the much larger thermal mass of the multilayer package 104.

The solder balls 108 may comprise spherical balls of metal to provide electrical, thermal and physical contact between the IC 106 and the multi-layer IC package 104. In making the contact with the solder balls 108, the IC may be pressed with enough force to squash the metal spheres somewhat, and may be performed at an elevated temperature to provide suitable electrical resistance and physical bond strength. The solder balls 108 may also be utilized to provide electrical, thermal and physical contact between the multi-layer IC package 104 and a printed circuit board comprising other parts of the wireless system 420, described with respect to FIG. 4.

The multi-layer IC package 104 may comprise one or more layers of metal and/or insulating material (various embodiments may also comprise ferromagnetic and/or ferromagnetic areas and/or layers). In this regard, the package 104 may be fabricated in a manner similar to or the same as an IC. Accordingly, the layers may be utilized to realize circuit elements such as resistors, inductors, capacitors, transmission lines, switches, antennas, etc. In this regard, a plurality of elements of the phased array antenna 102 may be fabricated in and/or on the package 104. Accordingly, each of the plurality of antenna elements may transmit and/or receive signals which are phase shifted with respect to other transmitted and/or received signals.

Figure 4:
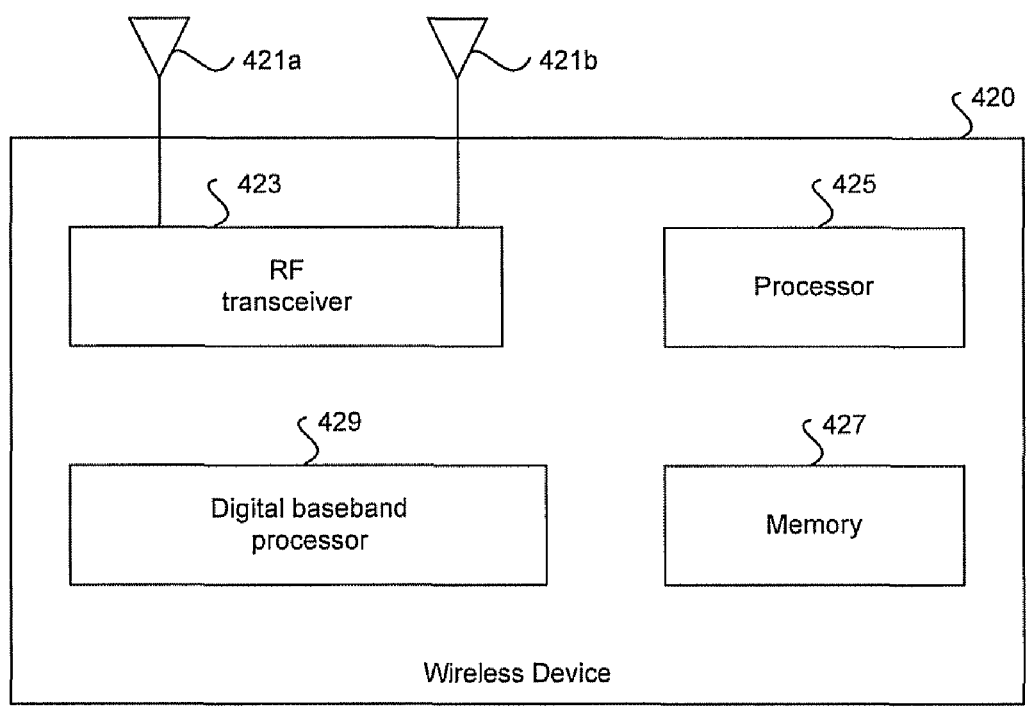
FIG. 4 is a block diagram illustrating an exemplary wireless device, in accordance with an embodiment of the invention.

The phased array antenna 102 may comprise a plurality of antenna elements, where each may be a metallic and/or conductive structure capable of coupling RF energy to/from, for example, the transceiver 423 described with respect to FIG. 4. In various embodiments of the invention, each element may be rectangular, circular, and/or another shape. One or more of the elements may be coupled (by way of one or more vias and/or one or more metal layers) to one or more of the solder balls 108. In this manner, signals may be conveyed to/from the package 104. In the exemplary embodiment depicted, four elements corresponding to four phases are utilized. Accordingly, four phase shifted representations of a reference signal may be transmitted and/or received via the antenna 102. Details of the exemplary four element phased array antenna are described below with respect to FIG. 1B.

In operation, logic, circuitry, and/or code in the IC 106 and/or in another device coupled to the package 104 (e.g., located on a PCB and coupled via one or more of the solder balls 108) may transmit and/or receive signals via the phased array antenna 102. The phasing of the signals coupled to the antenna elements may be controlled to achieve a desired radiation pattern. In this manner, sensitivity and/or power in a desired direction may be increased over sensitivity and/or power in another direction.

Figure 1B:
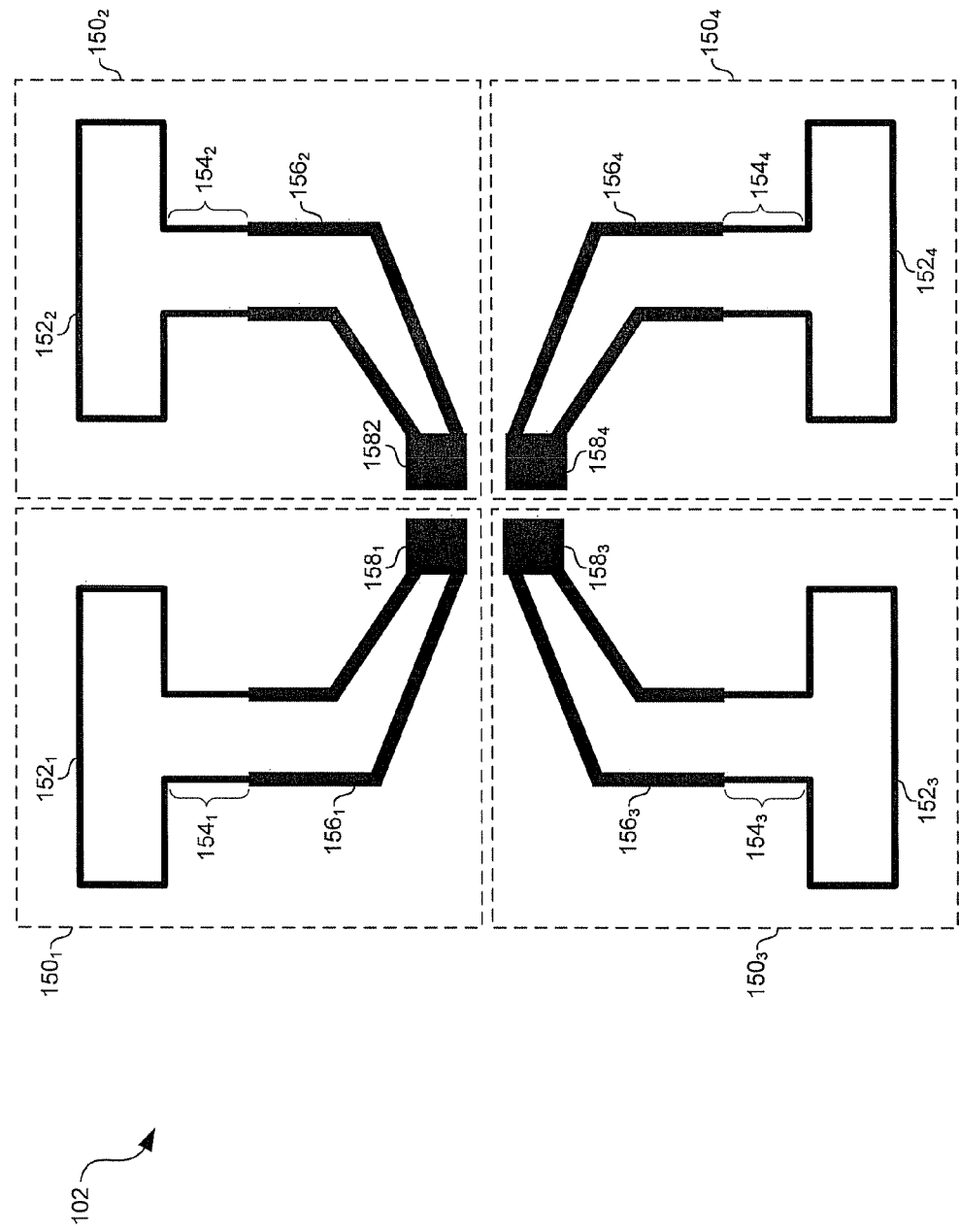
FIG. 1B is a diagram of an exemplary phased array antenna embedded in and/or on an IC package, in accordance with an embodiment of the invention.

FIG. 1B is a diagram of an exemplary phased array antenna embedded in and/or on an IC package, in accordance with an embodiment of the invention. Referring to FIG. 1B, the phased array antenna may comprise four antenna elements $150_1, \ldots, 150_4$ (referred collectively herein as 150). Each element 150 may comprise a folded dipole radiating element $152_1, \ldots, 152_4$ (referred collectively herein as 152), a quarter wavelength transformer $154_1, \ldots, 154_4$ (referred collectively herein as 154), a feeder line $156_1, \ldots, 156_4$ (referred collectively herein as 156), and an interconnection $158_1, \ldots, 158_4$ (referred collectively herein as 158).

The folded dipole radiating elements 152 may each be a metallic and/or conductive material capable of receiving and/or transmitting RF energy via a wireless channel/medium. In this regard, the dipole radiating elements $152_1$-$152_4$ may be fabricated in, for example, planar transmission line (e.g., microstrip and/or stripline). The physical size of the dipoles may affect which frequency band(s) are best transmitted and/or received. Each dipole radiating element 152 may transmit a signal which may be phase shifted relative to the signal transmitted by the other dipole radiating elements 152.

The quarter wavelength transformers 154 may each be a length of, for example, planar transmission line (e.g., microstrip and/or stripline). The length and/or width of quarter wavelength transformer may depend on the frequency of transmission and/or reception as well as the impedance of the dipole radiating elements 152 and the feeder lines 156. In this regard, the quarter wavelength transformers 154 may impedance match the feeder lines to the folded dipole radiating elements 152.

The feeder lines 156 may each be a length of, for example, planar or coplanar transmission line utilized to couple RF signals to from the folded dipole radiating elements 152.

The interconnections 158 may each be a via and/or one or more metal layers in the package 104 which couple the feeder lines 156 to one or more solder balls 108 which couple the package 104 to the IC 106.

In an exemplary embodiment, the phased array antenna 102 may be designed to transmit and/or receive signals at or near 60 GHz. In this regard, an exemplary embodiment may be realized on an approximately 5 mm by 5 mm multi-layer integrated circuit package.

Figure 2A:
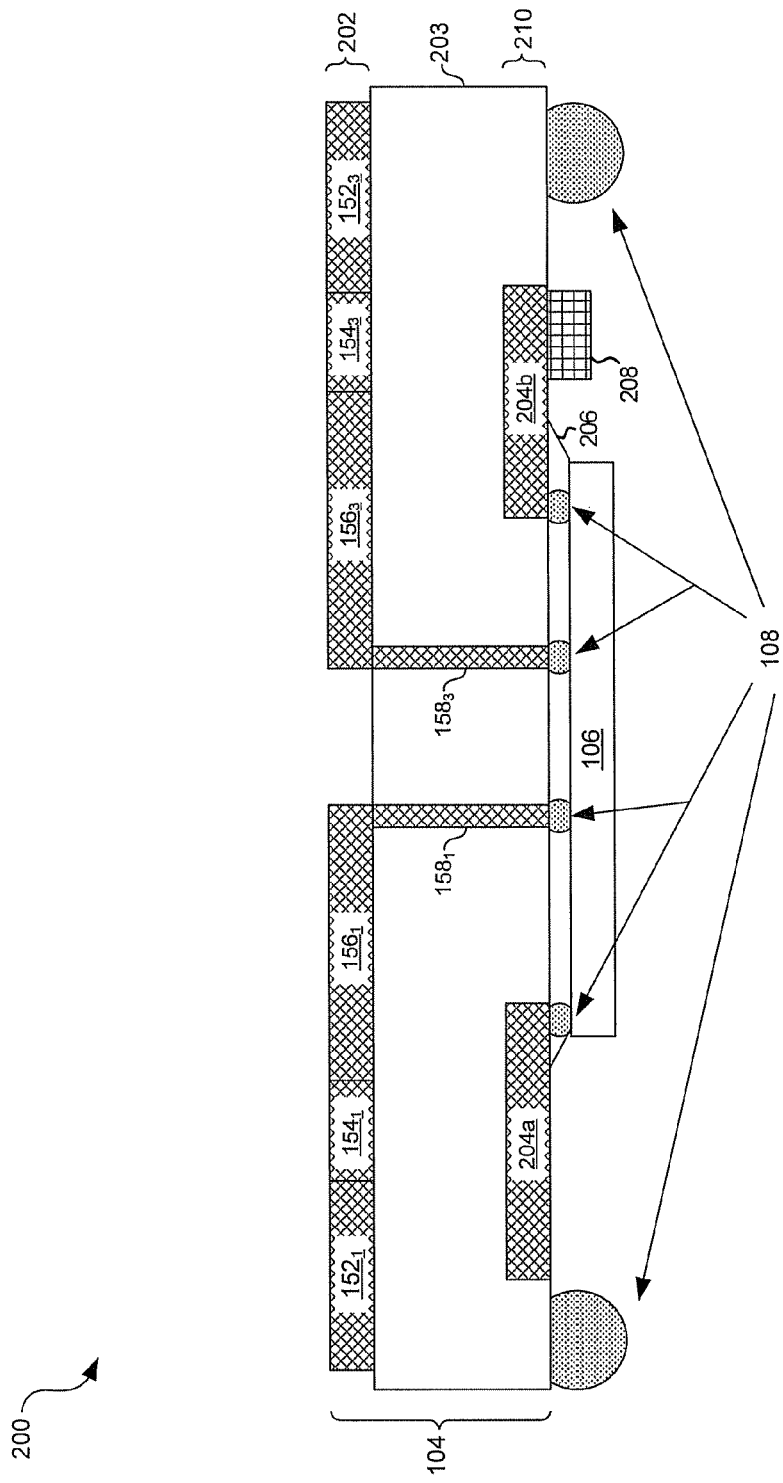
FIG. 2A is a diagram illustrating a cross sectional view of a multi-layer IC package with embedded phased array antenna, in accordance with an embodiment of the invention.

FIG. 2A is a diagram illustrating a cross sectional view of a multi-layer IC package with embedded phased array antenna, in accordance with an embodiment of the invention. Referring to FIG. 2A, there is shown a system 200 comprising a IC 106 and a multi-layer IC package 104. The multi-layer IC package 104 may comprise an insulating material 203, and metal layers 202 and 210. Although only two metal layers are shown, various embodiments of the invention may comprise any number of metal layers. The phased array antenna 102 may be fabricated in the metal layer 202 and one or more other components such as resistors, capacitors, inductors, transmission lines, phase shifters, etc. may be fabricated in the metal layer 210. The IC 106 may be communicatively coupled to the package 104, and the package 104 to a PCB (not shown), via solder balls 108. One or more surface mount components 208 may be mounted to the package 104. Thermal epoxy (or similar material) 206 may be pressed between the IC 106 and the package 104.

The IC 106 may be as described with respect to FIG. 1.

The solder balls 108 may be as described with respect to FIG. 1.

The surface mount device 208 may comprise a discrete circuit element such as a resistor, capacitor, inductor, or diode, for example. The surface mount device 208 may be soldered to the multi-layer IC package 104 to provide electrical contact. In various embodiments of the invention, additional surface mount elements or no surface mount elements may be coupled to the package 104.

In an exemplary embodiment of the invention, the metal layer 202, may comprise a deposited metal layer utilized to delineate the phased array antenna 102 described with respect to FIGS. 1A and 1B. In this regard, the metal layer 202 may be deposited as, for example, planar transmission line (e.g. microstrip) in shapes and/or sizes which enable realizing, for example, folded dipole radiating elements 152, quarter wavelength transformers 154, and feeder lines 156.

The interconnections 158 may be realized in the form of one of more vias which may be communicatively coupled the phased array antenna 102 to one or more of the solder balls 108.

In an exemplary embodiment of the invention, the metal layer 210 may comprise deposited metal layers utilized to delineate discrete components, waveguides, transmission lines, interconnections, etc. For example, the component 204a may be an inductor fabricated in metal layer 210. Furthermore, the transmission line 204b may couple the discrete component 208 to a solder ball 108. In this manner, signals may be conveyed to and/or from the antenna elements 102 in the metal layer 202.

In operation, the IC 106 and associated package 104 may be utilized to transmit and/or receive RF signals. The IC 106 may be communicatively coupled to the phased array antenna embedded on and/or within the multi-layer IC package 104. The directivity of the phased array antenna may be controlled by altering the phases of signals sent and/or received to/from the phased array antenna. For example, a signal to be transmitted may be modulated onto an RF carrier and four phase-shifted versions of the RF carrier may be generated. Accordingly, each signal may be coupled, via one or more solder balls 108, to the antenna 102. In this regard, each signal may be coupled to a corresponding folded dipole radiating element 152 via an interconnection 158, feeder line 156, and quarter wavelength transformer 154.

Figure 2B:
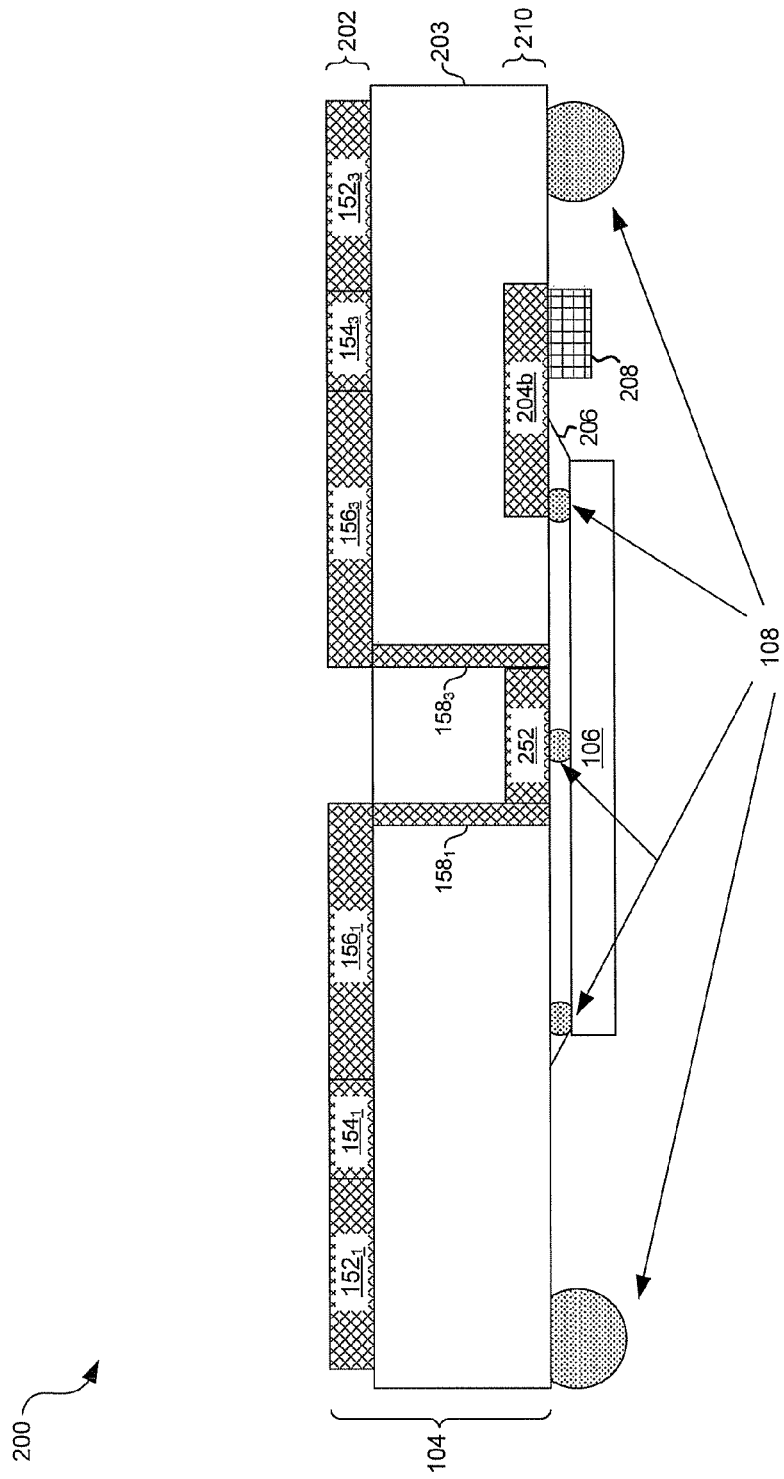
FIG. 2B is a diagram illustrating a cross sectional view of a multi-layer IC package with embedded phased array antenna and phase shifters, in accordance with an embodiment of the invention.

FIG. 2B is a diagram illustrating a cross sectional view of a multi-layer IC package with embedded configurable antenna and phase shifters, in accordance with an embodiment of the invention. Referring to FIG. 2B, there is shown a multi-layer IC package 104 with integrated phased array antenna similar to FIG. 2B. However, FIG. 2B differs from FIG. 2A in that the package 104 in FIG. 2B comprises phase shifter 252. In this regard, an RF signal coupled from interconnection 1581 to the IC 106 may experience a first phase delay while an RF signal coupled from the interconnection 1583 may experience a second phase delay. Although not shown, signals to additional interconnections 158 each may experience a different phase shift.

Figure 3:
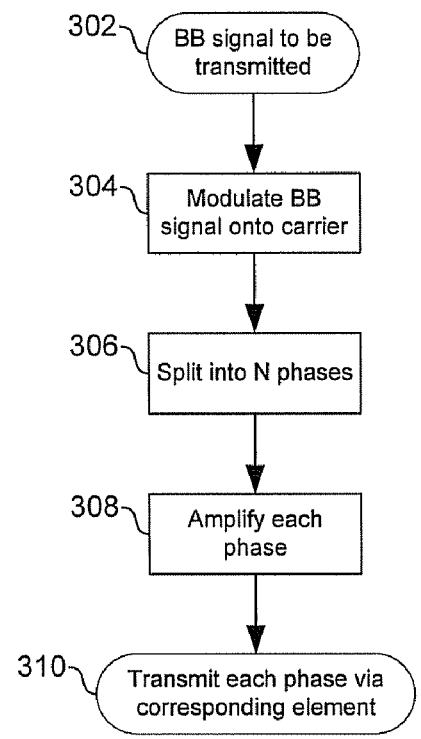
FIG. 3 is a flow chart illustrating exemplary steps for transmitting signals utilizing a phased array antenna embedded in and/or on an IC package, in accordance with an embodiment of the invention.

FIG. 3 is a flow chart illustrating exemplary steps for transmitting signals utilizing a phased array antenna embedded in a multi-layer IC package, in accordance with an embodiment of the invention. Referring to FIG. 3, the exemplary steps may begin with step 302 when a baseband signal may be ready for transmission. Subsequent to step 302, the exemplary steps may advance to step 304.

In step 304, the baseband signal may be modulated onto a carrier signal. For example, the baseband signal may be split into in-phase and quadrature phase signals and modulated onto a pair of phase quadrature carrier signals. In this regard, various embodiments of the invention may utilize carriers at or near 60 GHz. The modulated signals may then be combined to generate an RF signal. Subsequent to step 304, the exemplary steps may advance to step 306.

In step 306, the RF signal generated in step 304 may be split into a plurality of phases. For example, in the embodiment depicted in FIGS. 1A and 1B, the signal may be split into four phases. In this regard, the phasing of the signals may be utilized to control the directivity of the phased array antenna. Subsequent to step 306, the exemplary steps may advance to step 308.

In step 308, the RF signals may be amplified. In this regard, a power amplifier may amplify the signals such that sufficient signal strength may be radiated via the phased array antenna. Subsequent to step 308, the exemplary steps may advance to step 310.

In step 310, the amplified signals may be conveyed to the phased array antenna for transmission. In this regard, a number of phases may be conveyed to a corresponding number of radiating elements.

Steps similar to those described with respect to FIG. 3 may also be applied to receiving signals via a phased array antenna integrated into an IC package.

FIG. 4 is a block diagram illustrating an exemplary wireless device, in accordance with an embodiment of the invention. Referring to FIG. 4, there is shown a wireless device 420 that may comprise an RF receiver 423a, an RF transmitter 423b, a digital baseband processor 429, a processor 425, and a memory 427. A receive antenna 421a may be communicatively coupled to the RF receiver 423a. A transmit antenna 421b may be communicatively coupled to the RF transmitter 423b. The wireless device 420 may be operated in a system, such as the cellular network and/or digital video broadcast network, for example.

The antennas 421a and 421b may be phased array antennas, similar to, or the same as, the antenna 102 described with respect to FIG. 1A. In this regard, the directivity of the antennas may be controlled by controlling the phase(s) of signals coupled to the antenna.

The RF receiver 423a may comprise suitable logic, circuitry, and/or code that may enable processing of received RF signals. The RF receiver 423a may enable receiving RF signals in a plurality of frequency bands. For example, the RF receiver 423a may enable receiving signals in extremely high frequency (e.g., 60 GHz) bands. The receiver 423a may be enabled to receive, filter, amplify, down-convert, and/or perform analog to digital conversion. The RF receiver 423a may down convert a received RF signal. In this regard, the RF receiver 423a may perform direct down conversion of the received RF signal to a baseband or may convert the received RF signal to an intermediate frequency (IF). In various embodiments of the invention, the receiver 423a may perform quadrature down-conversion where in-phase components and quadrature phase components may be processed in parallel. The receiver 423a may be enabled to receive signals via the antenna 421a, which may be a phased array antenna embedded in and/or on an integrated circuit package, as described with respect to FIGS. 1A, 1B, 2A, and 2B. In various embodiments of the invention, the wireless device 420 may comprise a plurality of the receivers 423a and may thus support multiple frequency bands and or simultaneous reception of signals in the same frequency band.

The digital baseband processor 429 may comprise suitable logic, circuitry, and/or code that may enable processing and/or handling of baseband signals. In this regard, the digital baseband processor 429 may process or handle signals received from the RF receiver 423a and/or signals to be transferred to the RF transmitter 423b, when the RF transmitter 423b is present, for transmission to the network. The digital baseband processor 429 may also provide control and/or feedback information to the RF receiver 423a and to the RF transmitter 423*b* based on information from the processed signals. In this regard, the baseband processor 429 may provide one or more control signals for configuring phase shifting of received and/or transmitted RF signals. In this regard, the phase shift applied to RF signals may enable controlling the directivity of the phased array antenna. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423*b* for transmission to the network.

The RF transmitter 423*b* may comprise suitable logic, circuitry, and/or code that may enable processing of RF signals for transmission. The transmitter 423*b* may be enabled to transmit signals via the antenna 421*b*, which may be a phased array antenna fabricated in an integrated circuit package as described with respect to FIGS. 1A, 1B, 2A, and 2B. The RF transmitter 423*b* may enable transmission of RF signals in a plurality of frequency bands. For example, the RF transmitter 423*b* may enable transmitting signals in extremely high frequency (e.g., 60 GHz) bands. Each frequency band supported by the RF transmitter 423*b* may have a corresponding front-end circuit for handling amplification and up conversion operations, for example. In this regard, the RF transmitter 423*b* may be referred to as a multi-band transmitter when it supports more than one frequency band. In another embodiment of the invention, the wireless device 420 may comprise more than one RF transmitter 423*b*, wherein each of the RF transmitter 423*b* may be a single-band or a multi-band transmitter.

In various embodiments of the invention, the RF transmitter 423*b* may perform direct up conversion of the baseband signal to an RF signal. In some instances, the RF transmitter 423*b* may enable digital-to-analog conversion of the baseband signal components received from the digital baseband processor 429 before up conversion. In other instances, the RF transmitter 423*b* may receive baseband signal components in analog form.

The processor 425 may comprise suitable logic, circuitry, and/or code that may enable control and/or data processing operations for the wireless device 420. The processor 425 may be utilized to control at least a portion of the RF receiver 423*a*, the RF transmitter 423*b*, the digital baseband processor 429, and/or the memory 427. In this regard, the processor 425 may generate at least one signal for controlling operations within the wireless device 420. In this regard, the baseband processor 429 may provide one or more control signals for controlling a phase of signals transmitted and/or received via the phased array antennas 421*a* and 421*b*. The processor 425 may also enable executing of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to control phase of signals transmitted and/or received via the antenna(s) 421*a* and 421*b*. In this regard, the memory may store control and/or configuration information for configuring one or more phase shifters.

Aspects of a method and system for configurable antenna in an integrated circuit package are provided. In this regard, a phased array antenna (e.g., 102) embedded in a multi-layer integrated circuit (IC) package (e.g., 104) may be utilized for transmitting and/or receiving signals. The multi-layer package may comprise one or more metal layers (e.g., 202 and 210), insulating material (e.g., 203), ferromagnetic, and/or ferrimagnetic material. In an exemplary embodiment of the invention, the antenna may comprise one or more planar transmission lines. The phased array antenna may comprise a plurality of antenna elements (e.g., 150) and each antenna element may comprise an interconnection (e.g., 158) for communicatively coupling to an associated transmitter and/or receiver, a feeder line (e.g., 156), a quarter wavelength transformer (e.g., 154), and a radiating portion (e.g. folded dipole 152). Also in various exemplary embodiments of the invention, an IC (e.g., 106) enabled to transmit and/or receive signals may be bonded to the multi-layer IC package via one or more solder balls (e.g., 211). Accordingly, the IC may communicate a reference signal and/or one or more phase shifted versions of said reference signal to the antenna. In an exemplary embodiment of the invention, one or more phase shifters (e.g., 252) (fabricated, for example, in planar transmission line) may be embedded in the multi-layer IC package and may be controlled via logic, circuitry, and/or code within an IC bonded to the multi-layer IC package.

Another embodiment of the invention may provide a machine-readable storage, having stored thereon, a computer program having at least one code section executable by a machine, thereby causing the machine to perform the steps as described herein for a phased array antenna in an integrated circuit package.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
in an integrated circuit package, said integrated circuit package comprising a plurality of antenna elements and at least two phase shifters:
receiving a first signal via a bond wire and/or solder bump;
generating a plurality of phase-shifted signals from said first signal via at least two phase shifters; and
conveying each one of said phase-shifted signals to a corresponding one of said antenna elements.

2. The method according to claim 1, wherein each of said antenna elements comprises a folded dipole.

3. The method according to claim 2, wherein each of said antenna elements comprises a quarter-wavelength transformer coupled to said folded dipole.

4. The method according to claim 1, wherein:
said plurality of antenna elements comprises four antenna elements; and
said plurality of phase-shifted signals comprises four phase-shifted signals.

5. The method according to claim 1, wherein each of said antenna elements is constructed of planar transmission line.

6. A method, comprising:
in an integrated circuit package, said integrated circuit package comprising a plurality of antenna elements and at least two phase shifters:
receiving a plurality of signals via said plurality of antenna elements;
phase shifting each of said received signals via said at least two phase shifters to generate a plurality of phase-shifted signals;
combining said plurality of phase-shifted signals to generate a received signal; and
outputting said received signal via a bond wire and/or solder bump.

7. The method according to claim 6, wherein each of said antenna elements comprises a folded dipole.

8. The method according to claim 7, wherein each of said antenna elements comprises a quarter-wavelength transformer coupled to said folded dipole.

9. The method according to claim 6, wherein said plurality of antenna elements comprises four antenna elements.

10. The method according to claim 6, wherein each of said antenna elements is constructed of planar transmission line.

11. A system, comprising:
one or more circuits in an integrated circuit package, said one or more circuits comprising a plurality of antenna elements and at least two phase shifters, said one or more circuits being operable to:
receive a first signal via a bond wire and/or solder bump;
generate a plurality of phase-shifted signals from said first signal via said at least two phase shifters; and
convey each one of said phase-shifted signals to a corresponding one of said antenna elements.

12. The system according to claim 11, wherein each of said antenna elements comprises a folded dipole.

13. The system according to claim 11, wherein each of said antenna elements comprises a quarter-wavelength transformer coupled to said folded dipole.

14. The system according to claim 11, wherein:
said plurality of antenna elements comprises four antenna elements; and
said plurality of phase-shifted signals comprises four phase-shifted signals.

15. The system according to claim 11, wherein each of said antenna elements is constructed of planar transmission line.

16. A system, comprising:
one or more circuits in an integrated circuit package, said one or more circuits comprising a plurality of antenna elements and one or more phase shifters, said at least two circuits being operable to:
receive a plurality of signals via said plurality of antenna elements;
phase shift each of said received signals via said at least two phase shifters to generate a plurality of phase-shifted signals;
combine said plurality of phase-shifted signals to generate a received signal; and
output said received signal via a bond wire and/or solder bump.

17. The system according to claim 16, wherein each of said antenna elements comprises a folded dipole.

18. The system according to claim 17, wherein each of said antenna elements comprises a quarter-wavelength transformer coupled to said folded dipole.

19. The system according to claim 16, wherein said plurality of antenna elements comprises four antenna elements.

20. The system according to claim 16, wherein each of said antenna elements is constructed of planar transmission line.

* * * * *